(12) United States Patent  
Tsai et al.

(10) Patent No.: US 9,660,146 B2  
(45) Date of Patent: May 23, 2017

(54) LIGHT-EMITTING ELEMENT

(71) Applicant: EPISTAR CORPORATION, Hsinchu (TW)

(72) Inventors: Ching-Yuan Tsai, Hsinchu (TW); Hsin-Chan Chung, Hsinchu (TW); Wen-Luh Liao, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/070,727

(22) Filed: Mar. 15, 2016

(65) Prior Publication Data

US 2016/0197242 A1     Jul. 7, 2016

Related U.S. Application Data

(63) Continuation of application No. 14/866,232, filed on Sep. 25, 2015, now Pat. No. 9,318,663, which is a continuation of application No. 14/302,036, filed on Jun. 11, 2014, now Pat. No. 9,153,747.

(30) Foreign Application Priority Data

Jul. 10, 2013   (TW) ............................. 102124862 A

(51) Int. Cl.
| | |
|---|---|
| *H01L 33/00* | (2010.01) |
| *H01L 33/44* | (2010.01) |
| *H01L 33/42* | (2010.01) |
| *H01L 33/38* | (2010.01) |
| *H01L 33/46* | (2010.01) |
| *H01L 33/14* | (2010.01) |

(52) U.S. Cl.  
CPC .............. *H01L 33/44* (2013.01); *H01L 33/38* (2013.01); *H01L 33/42* (2013.01); *H01L 33/46* (2013.01); *H01L 33/14* (2013.01)

(58) Field of Classification Search  
CPC ......... H01L 33/58; H01L 33/42; H01L 33/60; H01L 33/20; H01L 33/62; H01L 33/54  
See application file for complete search history.

(56) References Cited

U.S. PATENT DOCUMENTS

| | | | |
|---|---|---|---|
| 6,914,268 B2 * | 7/2005 | Shei | ........................ H01L 33/46 257/99 |
| 7,119,372 B2 | 10/2006 | Stokes et al. | |
| 7,906,795 B2 | 3/2011 | Huang et al. | |
| 9,054,269 B2 | 6/2015 | Okuno | |

FOREIGN PATENT DOCUMENTS

| | | |
|---|---|---|
| TW | 201034252 A1 | 9/2010 |
| TW | 201216532 A1 | 4/2012 |

\* cited by examiner

*Primary Examiner* — (Vikki) Hoa B Trinh  
(74) *Attorney, Agent, or Firm* — Ditthavong & Steiner, P.C.

(57) ABSTRACT

A light-emitting element comprises a light-emitting stack comprising an active layer for emitting a light; a window layer on the light-emitting stack; and a first insulative layer having a first refractive index on the window layer; wherein the first insulative layer has a first refractive index, and the window layer has a second refractive index, and a difference between the first refractive index and the second refractive index is larger than 1.5.

16 Claims, 5 Drawing Sheets

LIGHT-EMITTING ELEMENT

REFERENCE TO RELATED APPLICATION

This application is a continuation application of U.S. patent application Ser. No. 14/866,232, filed Sep. 25, 2015, which is a continuation in-part application of U.S. patent application Ser. No. 14/302,036, now U.S. Pat. No. 9,153,747, filed Jun. 11, 2014, which claims the right of priority based on TW application Serial No. 102124862, filed on Jul. 10, 2013, the contents of which are hereby incorporated by reference in their entireties.

TECHNICAL FIELD

The disclosure is related to a light-emitting element and more particularly, a light-emitting element with high reflectivity.

DESCRIPTION OF THE RELATED ART

Optical element such as LEDs are widely adopted in optical display devices, traffic lights, information storage apparatuses, communication apparatuses, lighting apparatuses, and medical appliances. The abovementioned LEDs can further connect to other devices for forming a light-emitting device. FIG. 1 illustrates a schematic structure of a light-emitting device. As shown in FIG. 1, a light-emitting device 1 includes a sub-carrier 12 having a circuit 14, a soldering material 16 on the sub-carrier 12 for mounting the LED 11 on the sub-carrier 12 and electrically connecting the LED 11 with the circuit 14 of the sub-carrier 12, and an electrical connecting structure 18 for electrically connecting with an electrode 15 of the LED 11 and the circuit 14 of the sub-carrier 12. The abovementioned sub-carrier 12 can be a lead frame or mounting substrate with a large size.

SUMMARY OF THE DISCLOSURE

A light-emitting element comprises a light-emitting stack comprising an active layer for emitting a light; a window layer on the light-emitting stack; and a first insulative layer having a first refractive index on the window layer; wherein the first insulative layer has a first refractive index, and the window layer has a second refractive index, and a difference between the first refractive index and the second refractive index is larger than 1.5.

BRIEF DESCRIPTION OF THE DRAWING

The accompanying drawing is included to provide easy understanding of the application, and is incorporated herein and constitutes a part of this specification. The drawing illustrates the embodiment of the application and, together with the description, serves to illustrate the principles of the application.

DETAILED DESCRIPTION OF THE EMBODIMENTS

Figure 1:
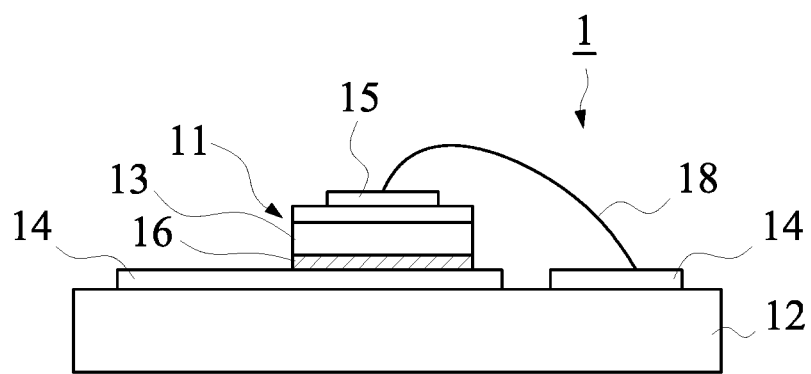
FIG. 1 illustrates a schematic structure of a conventional light-emitting device.

To better and concisely explain the application, the same name or the same reference number given or appeared in different paragraphs or figures along the specification should has the same or equivalent meanings while it is once defined anywhere of the application.

The following shows the description of embodiments of the application in accordance with the drawing.

First Embodiment

Figure 2A:
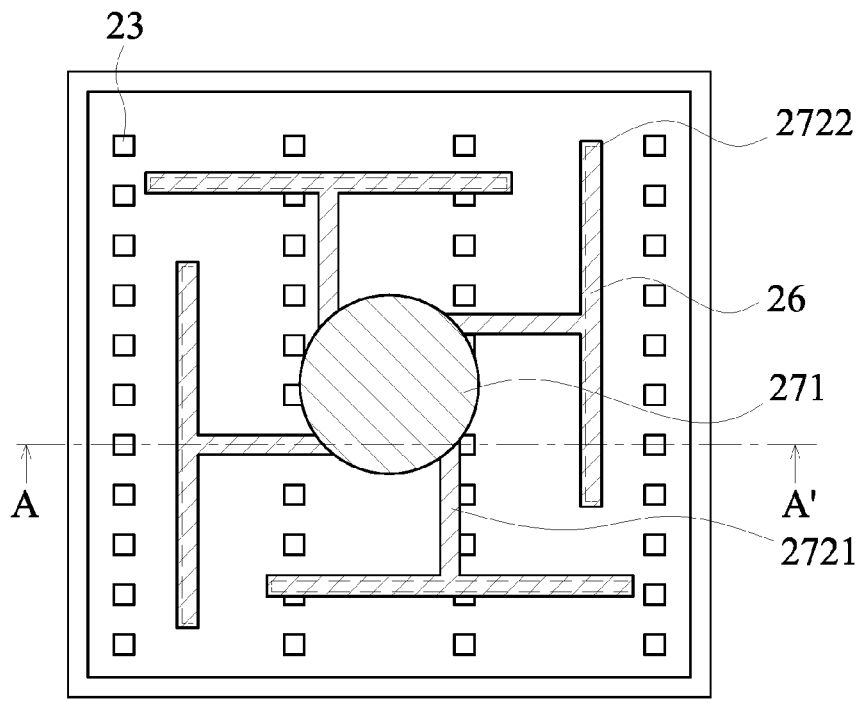
FIG. 2A illustrates a top view of a light-emitting element in accordance with an embodiment of the application.
Figure 2B:
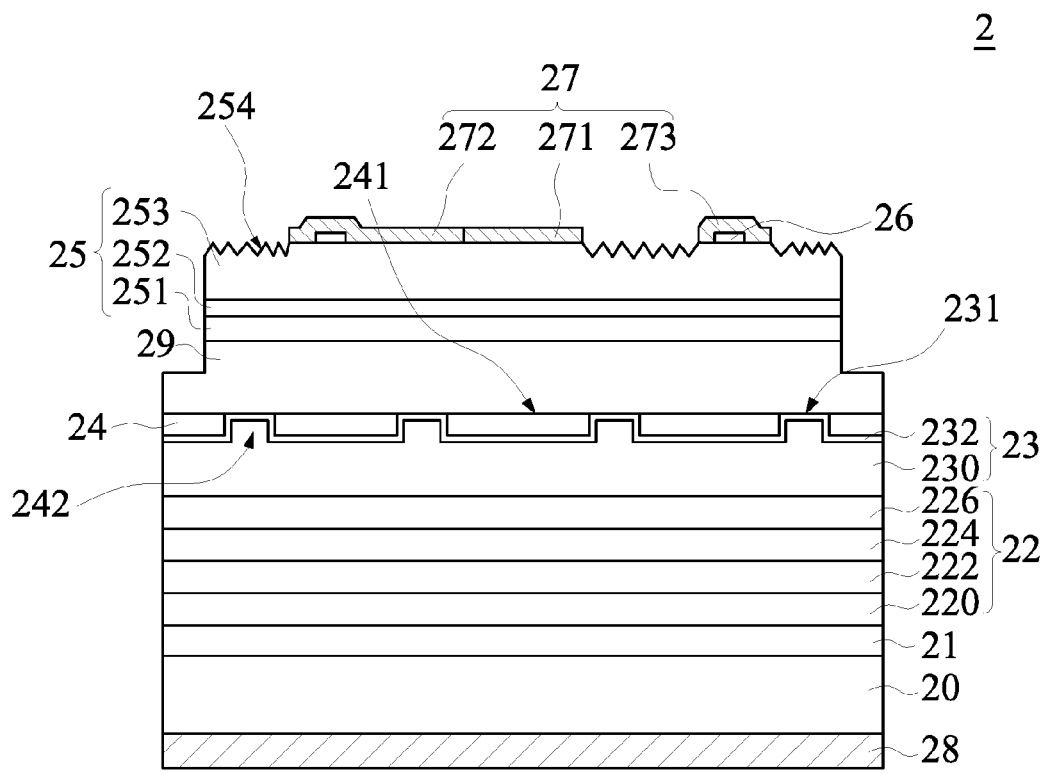
FIG. 2B illustrates a cross section of FIG. 2A along a profile line AA' in accordance with one embodiment.

FIG. 2A illustrates a top view of a light-emitting element in accordance with an embodiment of the application. FIG. 2B illustrates a cross section of FIG. 2A along a profile line AA'. As shown in FIG. 2B, a light-emitting element 2 includes a substrate 20, a conducting adhesive layer 21 on the substrate 20, a reflection structure 22 on the conducting adhesive layer 21, a transparent conducting structure 23 on the reflection structure 22, a window layer 29 on the transparent conducting structure 23, a non-oxide insulative layer 24 between the transparent conducting structure 23 and the window layer 29, a light-emitting stack 25 on the window layer 29, an electrical contact layer 26 on the light-emitting stack 25, a first electrode 27 on the light-emitting stack 25 and the electrical contact layer 26, and a second electrode 28 below the substrate 20, wherein the light-emitting stack 25 includes a first semiconductor layer 251 between the window layer 29 and the first electrode 27, an active 252 between the first semiconductor layer 251 and the first electrode 27, and a second semiconductor layer 253 between the active layer 252 and the first electrode 27.

The first electrode 27 and/or the second electrode 28 are for an external voltage and made of a transparent conducting material or a metal material. The transparent conducting material includes, but is not limited to indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO), aluminum gallium arsenide (AlGaAs), gallium nitride (GaN), gallium phosphide (GaP), gallium arsenide (GaAs), gallium arsenide phosphide (GaAsP), indium zinc oxide (IZO), or diamond like carbon (DLC). The metal material includes, but is not limited to aluminum (Al), chromium (Cr), copper (Cu), tin (Sn), gold (Au), nickel (Ni), titanium (Ti), platinum (Pt), lead (Pb), zinc (Zn), cadmium (Cd), antimony (Sb), cobalt (Co), or an alloy including the abovementioned. The first electrode 27 includes a current input portion 271 and an extension portion 272. As shown in FIG. 2A, the current input portion 271 is substantially on a center of the second semiconductor layer 253, the extension portion 272 includes a first branch 2721 extends from the current input portion 271 to a boundary of the light-emitting element 2, and a second branch 2722 extends from the first branch 2721 for improving current diffusion. As shown in FIG. 2B, the extension portion 272 includes a protrusive portion 273 on the electrical contact layer 26, covering at least one surface of the electrical contact layer 26 for increasing ohmic contact area with the electrical contact layer 26 and lowing resistance of the light-emitting element 2, wherein the protrusive portion 273 higher than the current input portion 271.

The electrical contact layer 26 is between the second branch 2722 and the light-emitting stack 25 for forming an ohmic contact between the second branch 2722 and the light-emitting stack 25. A resistance between the electrical contact layer 26 and the second branch 2722 and a resistance between the electrical contact layer 26 and the light-emitting stack 25 are less than a resistance between the first electrode 27 and the light-emitting stack 25. A material of the electrical contact layer 26 can be a semiconductor material including at least one element, like gallium (Ga), aluminum (Al), indium (In), phosphorus (P), nitrogen (N), zinc (Zn), cadmium (Cd), or selenium (Se). A polarity of the electrical contact layer 26 can be the same as the polarity of the second semiconductor layer 253.

A material of the light-emitting stack 25 can be a semiconductor material, including more than one element like gallium (Ga), aluminum (Al), indium (In), phosphorus (P), nitrogen (N), zinc (Zn), cadmium (Cd), or selenium (Se). The polarities of the first semiconductor 251 and the second semiconductor layer 253 are different for generating electrons or holes. A light-exiting upper surface 254 of the second semiconductor layer 253 can be a rough surface for reducing total internal reflection, so as to increase luminous efficiency of the light-emitting element 2. The active layer 252 can emit one or more kinds of color lights which are visible or invisible and can be a single-heterostructure, a double-heterostructure, a double side double-heterostructure, multi-quantum wells structure, or quantum dots. The polarity of the window layer 29 can be the same as the polarity of the first semiconductor layer 251 for serving as a light extraction layer to increase luminous efficiency of the light-emitting element 2. The window layer 29 with respect to light emitted from the active layer 252 is transparent. Additionally, a material of the window layer 29 can be a transparent conducting material including but is not limited to indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO), magnesium oxide (MgO), aluminum gallium arsenide (AlGaAs), gallium nitride (GaN), gallium phosphide (GaP), or indium zinc oxide (IZO).

The transparent conducting structure 23 with respect to light emitted from the light-emitting stack 25 is transparent and can improve the ohmic contact between the window layer 251 and the reflection structure 22, the current conduction, and the current diffusion. Additionally, the transparent conducting structure 23 and the reflection structure 22 can form an omni-directional reflector (ODR) which is made of a transparent material including but not limited to indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO), gallium phosphide (GaP), indium cerium oxide (ICO), indium tungsten oxide (IWO), indium titanium oxide (ITiO), indium zinc oxide (IZO), indium gallium oxide (IGO), gallium aluminum zinc oxide (GAZO), or a combination thereof. The transparent conducting structure 23 includes a first conducting oxide layer 230 below the non-oxide insulative layer 24 and a second conducting oxide layer 232 between the light-emitting stack 25 and the first conducting oxide layer 230. The materials of the first conducting oxide layer 230 and the second conducting oxide layer 232 are different. In another embodiment, the first conducting oxide layer 230 has at least one different element in comparison with the composition of the material of the second conducting oxide layer 232. For example, the material of the first conducting oxide layer 230 is indium zinc oxide (IZO) and the material of the second conducting oxide layer 232 is indium tin oxide (ITO). The second conducting oxide layer 232 can directly contact with the non-oxide insulative layer 24 and/or the window layer 29 and cover at least one surface of the non-oxide insulative layer 24.

Figure 3:
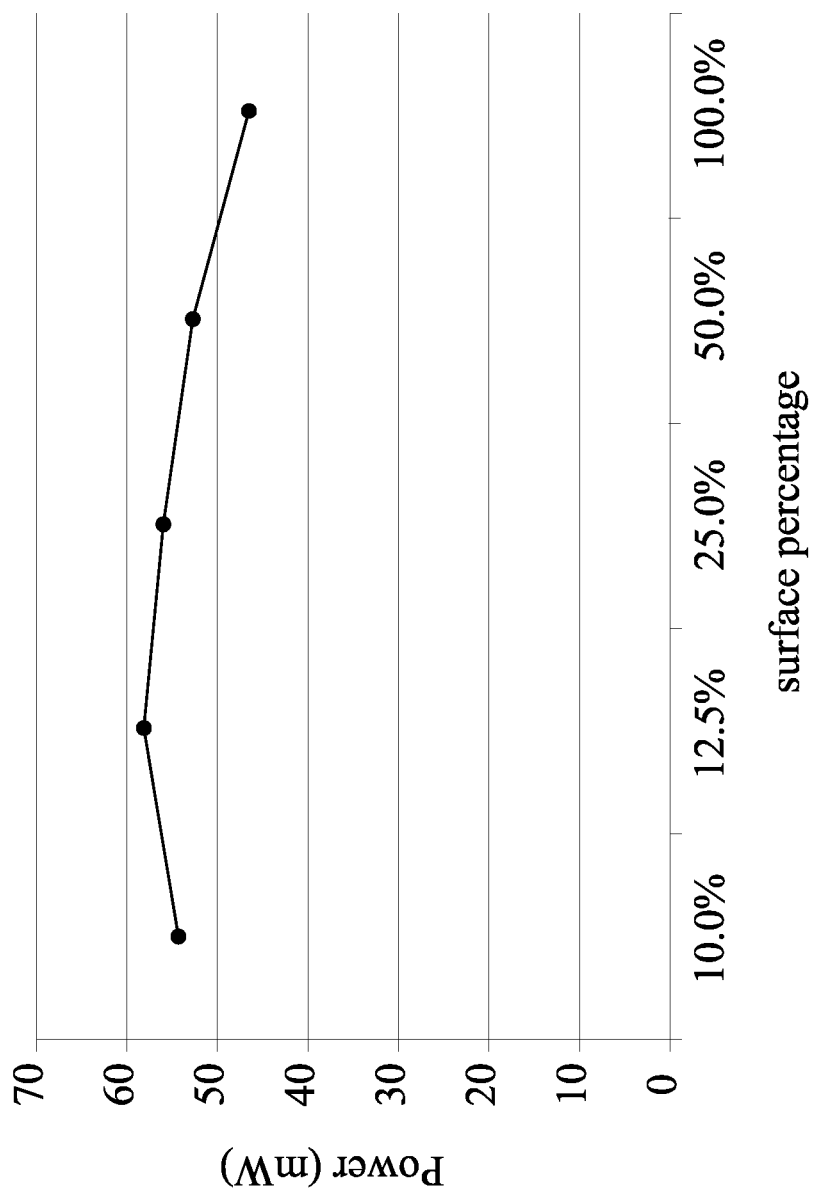
FIG. 3 illustrates the percentage of the surface area of the first contact upper surface to a sum of surface areas of the first contact upper surface and the second contact upper surface versus power.

The transmittance of the non-oxide insulative layer 24 to the light emitted from the light-emitting stack 25 is greater than 90% and the refractive index of the non-oxide insulative layer 24 is less than 1.4, which is better between 1.3~1.4. A material of the non-oxide insulative layer 24 can be a non-oxide insulative material, for example, benzocyclobutene (BCB), cyclic olefin copolymers (COC), fluorocarbon polymer, silicon nitride (SiNx). In another embodiment, a material of the non-oxide insulative layer 24 can include a halide, a compound of group IIA, or a compound of group VIIA, for example, calcium difluoride ($CaF_2$), carbon tetrafluoride ($CF_4$) or magnesium difluoride ($MgF_2$), and a refractive index of the non-oxide insulative layer 24 is less than refractive indexes of the window layer 29 and the transparent conducting structure 23. Since the refractive index of the non-oxide insulative layer 24 is less than the refractive indexes of the window layer 29 and the transparent conducting structure 23, and a critical angle of an interface between the window layer 29 and the non-oxide insulative layer 24 is less than a critical angle of an interface between the window layer 29 and the transparent conducting structure 23, the probability of total internal reflection that occurs when the light emitted from the light-emitting stack 25 passes through an interface between the light-emitting stack 25 and the non-oxide insulative layer 24 is increased accordingly. Additionally, the light that does not encounter total internal reflection at the interface between the window layer 29 and the transparent conducting structure 23 encounters totally internal reflection at the interface between the transparent conducting structure 23 and the non-oxide insulative layer 24 so the light extraction efficiency of the light-emitting element 2 is increased. The transparent conducting structure 23 has a first contact upper surface 231 contacting the window layer 29, and the non-oxide insulative layer 24 has a second contact upper surface 241 contacting the window layer 29. The first contact upper surface 231 and the second contact upper surface 241 are at the same level substantially, namely, a distance between the first contact upper surface 231 and the light-exiting upper surface 254 is substantially equal to a distance between the second contact upper surface 241 and the light-exiting upper surface 254. FIG. 3 illustrates the percentage of the surface area of the first contact upper surface to a sum of surface areas of the first contact upper surface and the second contact upper surface (hereafter, surface percentage) versus power of the light-emitting element 2. As shown in FIG. 3, when the surface area of the first contact upper surface 231 is about 10%~50% of a sum of the surface areas of the first contact upper surface 231 and the second contact upper surface 241, the power of the light-emitting element 2 is greater than 50 mW, which is better than that of a light-emitting element with a surface percentage greater than 50%. In a preferred embodiment, the surface percentage of the light-emitting element 2 is 12.5~25%, and in such case, power of the light-emitting element 2 can be greater than 55 mW. In other words, when a ratio of a surface area of the non-oxide insulative layer 24 to a surface area of the window layer 29 is about 0.5~0.9, the light-emitting element 2 has better power performance. In another embodiment, the second contact upper surface 241 can be a rough surface to scatter the light from the light-emitting stack 25 for increasing luminous efficiency of the light-emitting element 2. The non-oxide insulative layer 24 can be disposed as a pattern, for example, a pattern right under the electrical contact layer 26 and/or the current input portion 271 for diffusing a current. In another embodiment, the non-oxide insulative layer 24 can have random pattern or is not located right under the electrical contact layer 26 and/or the current input portion 271. A thickness of the non-oxide insulative layer 24 is less than a half of a thickness of the transparent conducting structure 23. In yet another embodiment, a thickness of the non-oxide insulative layer 24 is less than 1/5 of a thickness of the transparent conducting structure 23 to prevent a planarization process for the transparent conducting structure 23 from damaging the non-oxide insulative layer 24. At least one surface of the non-oxide insulative layer 24 is covered by the transparent conducting structure 23 for strongly joining the transparent conducting structure 23 to the window layer 29 so as to enhance mechanical strength. In another embodiment, the non-oxide insulative layer 24 can directly join the reflection structure 22 for preventing the transparent conducting structure 23 and the reflection structure 22 from peeling because of insufficient adhesion force. Additionally, the non-oxide insulative layer 24 further includes a plurality of pores 242 penetrating the non-oxide insulative layer 24 and the transparent conducting structure 23 fills the plurality of pores 242 for forming an ohmic contact.

The reflection structure 22 can reflect light emitted from the light-emitting stack 25, and the material of the reflection structure 22 can be metal material including, but not limited to copper (Cu), aluminum (Al), tin (Sn), gold (Au), silver (Ag), lead (Pb), titanium (Ti), nickel (Ni), platinum (Pt), tungsten (W) or an alloy made of the above mentioned. The reflection structure 22 includes a reflection layer 226, a reflective adhesion layer 224 below the reflection layer 226, a barrier layer 222 below the reflective adhesion layer 224, and an ohmic contact layer 220 below the barrier layer 222. The reflection layer 226 can reflect light emitted from the light-emitting stack 25, the reflective adhesion layer 224 adheres to the reflection layer 226 and the barrier 222, and the barrier layer 222 can prevent the material of the reflection layer 226 from diffusing to the ohmic contact layer 220 and damaging the reflection layer 226 so as to reduce the reflection efficiency of the reflection layer 226. The ohmic contact layer 220 has ohmic contacts with the conducting adhesive layer 21. The conducting adhesive layer 21 connects to the substrate 20 and the reflection structure 22 and includes a plurality of sub-layers (not shown in figures) and can be a transparent conducting material or a metal material. The transparent conducting material includes, but is not limited to indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), zinc oxide (ZnO), gallium phosphide (GaP), indium cerium oxide (ICO), indium tungsten oxide (IWO), indium titanium oxide (ITiO), indium zinc oxide (IZO), indium gallium oxide (IGO), gallium aluminum zinc oxide (GAZO), or a combination thereof. The metal material includes, but is not limited to copper (Cu), aluminum (Al), tin (Sn), gold (Au), silver (Ag), lead (Pb), titanium (Ti), nickel (Ni), platinum (Pt), tungsten (W), or an alloy made of the above mentioned.

The substrate 20 can support the light-emitting stack 25 and other layers or structures and be made of a transparent material or a conducting material. For example, the transparent material can include, but not limited to sapphire, diamond, glass, epoxy, quartz, acryl, $Al_2O_3$, zinc oxide (ZnO), or aluminum nitride (AlN); the conducting material can include, but be not limited to copper (Cu), aluminum (Al), molybdenum (Mo), tin (Sn), zinc (Zn), cadmium (Cd), nickel (Ni), cobalt (Co), diamond like carbon (DLC), graphite, carbon fiber, metal matrix composite (MMC), ceramic matrix composite (CMC), silicon (Si), zinc selenide (ZnSe), gallium arsenide (GaAs), silicon carbide (SiC), gallium phosphide (GaP), gallium arsenide phosphide (GaAsP), indium phosphide (InP), $LiGaO_2$, or $LiAlO_2$.

Figure 5:
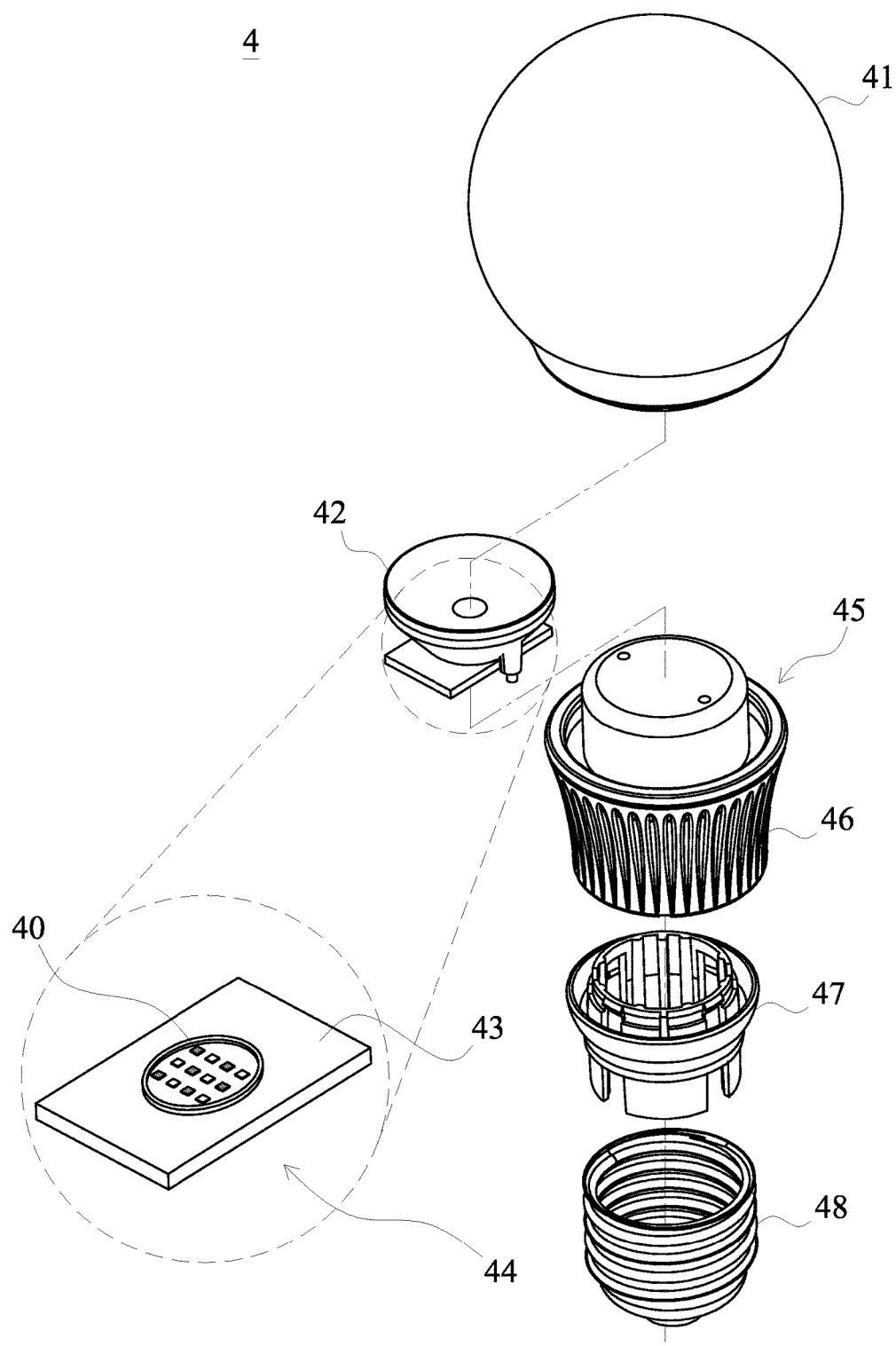
FIG. 5 illustrates an exploded view of a lamp in accordance with an embodiment of the application.

FIG. 5 illustrates an explored view of a lamp. A lamp 4 includes a lamp cover 41, a lens 42 in the lamp cover 41, a light-emitting module 44 under the lens 42, a base 45 having a heat sink 46 for carrying the light-emitting module 44, a connection portion 47, and an electrical connector 48, wherein the connection portion 47 connects to the base 45 and the electrical connector 48, and the light-emitting module 44 has a carrier 43 and a plurality of the light-emitting elements 40 of any of the abovementioned embodiments on the carrier 43.

Second Embodiment

Figure 4A:
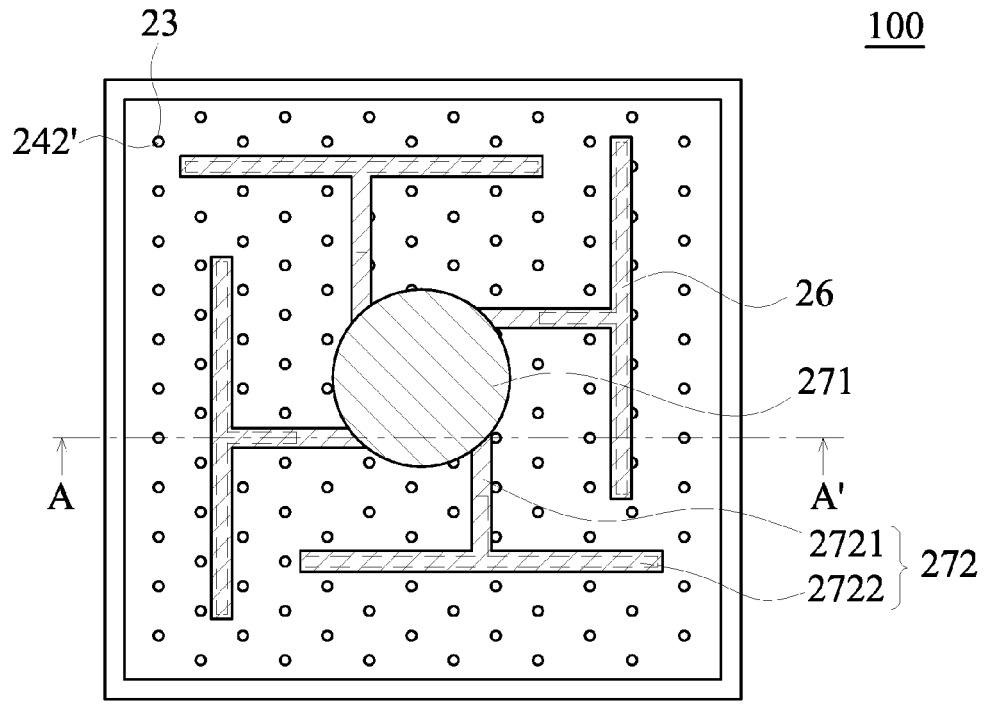
FIG. 4A illustrates a top view of a light-emitting element in accordance with an embodiment of the application.
Figure 4B:
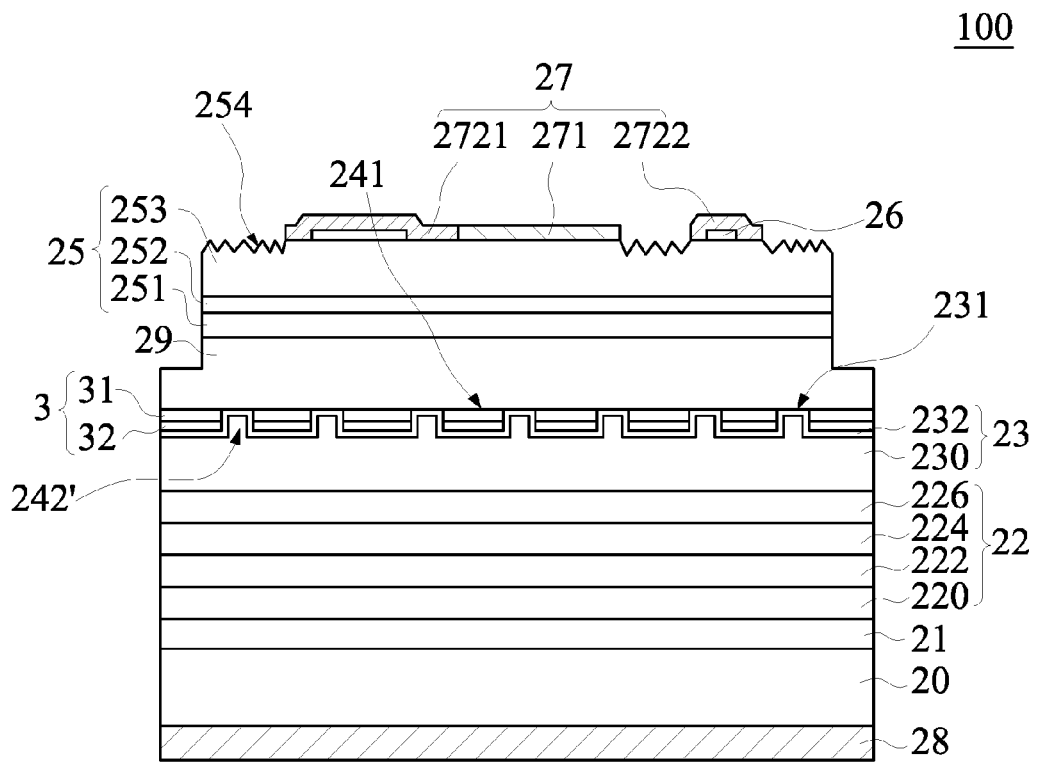
FIG. 4B illustrates a cross section of FIG. 4A along a profile line AA' in accordance with one embodiment.

FIG. 4B shows a cross section along a profile line AA' of FIG. 4A. As shown in FIG. 4B, a light-emitting element 100 includes a substrate 20, a conducting adhesive layer 21 on the substrate 20, a reflection structure 22 on the conducting adhesive layer 21, a transparent conducting structure 23 on the reflection structure 22, a window layer 29 on the transparent conducting structure 23, an insulative structure 3 between the transparent conducting structure 23 and the window layer 29, a light-emitting stack 25 on the window layer 29, an electrical contact layer 26 on the light-emitting stack 25, wherein the electrical contact layer 26 is patterned to cover a part of the light-emitting stack 25 and exposes another part of the light-emitting stack 25. A first electrode 27 on the light-emitting stack 25 and the electrical contact layer 26, and a second electrode 28 below the substrate 20. The light-emitting stack 25 includes a first semiconductor layer 251, an active 252, and a second semiconductor layer 253 sequentially on the window layer 29, wherein a part of the second semiconductor layer 253 contacts the electrical contact layer 26 and another part of the second semiconductor layer 253 is exposed from the electrical contact layer 26. In one embodiment, the first electrode 27 and/or the second electrode 28 are used for die-bonding to an external device, such as a package sub-mount or a printed circuit board through a wire or a solder bump. The material of the first electrode 27 and/or the second electrode 28 comprises transparent conducting material, such as indium tin oxide (ITO), indium zinc oxide (IZO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO), aluminum gallium arsenide (AlGaAs), gallium nitride (GaN), gallium phosphide (GaP), gallium arsenide (GaAs), gallium arsenide phosphide (GaAsP), diamond like carbon (DLC) and the combination thereof, or metal, such as aluminum (Al), chromium (Cr), copper (Cu), tin (Sn), gold (Au), nickel (Ni), titanium (Ti), platinum (Pt), lead (Pb), zinc (Zn), cadmium (Cd), antimony (Sb), cobalt (Co), and the combination thereof.

The first electrode 27 includes a current input portion 271 and an extension portion 272. As shown in FIG. 4A, the current input portion 271 is substantially on a center of the second semiconductor layer 253. The extension portion 272 includes multiple first branches 2721 radially extending from the current input portion 271 toward a boundary of the light-emitting element 100, and multiple second branches 2722 respectively extending from the first branches 2721 and parallel to the boundary of the light-emitting element 100 for improving current spreading over the second semiconductor layer 253. As shown in FIG. 4B, the electrical contact layer 26 is arranged as a plurality of stripes each of which is enclosed and fully covered by each of the second branches 2722. The electrical contact layer 26 is formed of semiconductor material, such as GaAs or GaN, and the polarity of the electrical contact layer 26 is the same as the polarity of the second semiconductor layer 253. The first electrode 27 comprises metal, such as Au, Ge, Ni, Ti, Pt, Al, Pd or the alloy thereof. Thus, the electrical contact layer 26 forms an ohmic contact with the extension portion 272 of the first electrode 27 for decreasing the electrical resistance between the extension portion 272 and the second semiconductor layer 253 and lowering the forward voltage of the light-emitting element 100. The current input portion 271 and the portion of the extension portion 272 not covering the electrical contact layer 26 directly contact the second semiconductor layer 253 and form a Schottky contact with the second semiconductor layer 253.

A material of the active layer 252 comprises a III-V compound material, e.g. $Al_pGa_qIn_{(1-p-q)}P$ wherein $0 \leq p, q \leq 1$ for emitting red, orange, yellow or amber light, or $Al_xIn_yGa_{(1-x-y)}N$ wherein, $0 \leq x, y \leq 1$ for emitting blue, UV or green light. The polarities of the first semiconductor 251 and the second semiconductor layer 253 are different for providing carriers, such as electrons or holes. A light-exiting upper surface 254 of the second semiconductor layer 253 not covered by the first electrode 27 is a rough surface for scattering the light from the light-emitting stack 25, so as to increase luminous efficiency of the light-emitting element 100. The active layer 252 can emit single or multiple colors of light and comprises a single-heterostructure (SH), a double-heterostructure (DH), a double side double-heterostructure (DDH), multi-quantum wells (MQW) structure, or quantum dots. A polarity or conductivity-type of the window layer 29 can be the same as that of the first semiconductor layer 251 for spreading current. The window layer 29 has a lower sheet resistance than the first semiconductor layer 251 and is transparent to light emitted from the active layer 252. Additionally, a material of the window layer 29 can be a transparent conducting oxide, such as indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO) and indium zinc oxide (IZO), or semiconductor material, such as aluminum gallium arsenide (AlGaAs), gallium nitride (GaN) and gallium phosphide (GaP).

The insulative structure 3 comprises a first insulative layer 31 and a second insulative layer 32, wherein the first insulative layer 31 is formed on and contacts the window layer 29, and the second insulative layer 32 is formed on the first insulative layer 31 and has the same shape as the first insulative layer 31 from the top-view of the light-emitting element 100. In the embodiment, the transmittances of the first insulative layer 31 and the second insulative layer 32 to the light emitted from the active layer 252 are both greater than 90%. The refractive index of the first insulative layer 31 is smaller than the refractive index of the window layer 29 and the refractive index of the second insulative layer 32. In one embodiment, the first insulative layer 31 is made of non-oxide material including a compound of group IIA, a compound of group IVA or a compound of group VIIA. Specifically, the non-oxide material comprises a compound with carbon-fluorine bond, such as $CF_4$, $C_2F_6$, $C_3F_6$, $C_3F_8$, $C_4F_8$, $C_5F_{12}$, $C_6F_{14}$, or other fluorocarbon having a formula of $C_xF_y$. Specifically, the non-oxide material comprises magnesium fluoride having a formula of $MgF_x$, such as $MgF_2$. The non-oxide material of the first insulative layer 31 has a refractive index between 1.3 and 1.4. The second insulative layer 32 is made of oxide, such as $SiO_x$, or nitride, such as $SiN_x$, and has a refractive index between 1.4 and 1.8. The first insulative layer 31 and the second insulative layer 32 are patterned to form multiple pores 242' exposing the window layer 29. When the first insulative layer 31 comprises magnesium difluoride ($MgF_2$), the first insulative layer 31 and the second insulative layer 32 can be patterned by lift-off process at the same time. When the first insulative layer 31 comprises fluorocarbon compound, the first insulative layer 31 and the second insulative layer 32 can be patterned by wet etching process at the same time wherein the wet-etching solution comprises buffered oxide etching solution (BOE) or hydrofluoric acid (HF). Therefore, the first insulative layer 31 and the second insulative layer 32 are textured to have the same patterns from a top view of the light-emitting element 100. From a top view of the light-emitting element 100, the multiple pores 242' are uniformly distributed on the window layer 29 for improving the electrical current distribution over the window layer 29. The top-view shape of the multiple pores 242' can be circle or polygon, such as square. As shown in FIG. 4A, the shape of each of the multiple pores 242' is a circle with a diameter between 2 μm and 20 μm.

Since the refractive index of the first insulative layer 31 is at least 0.5 less than the refractive indexes of the window layer 29, the first insulative layer 31 and the window layer 29 form a total-internal-reflection (TIR) interface to reflect the light emitted from the light-emitting stack 25.

The transparent conducting structure 23 has a first surface 231 contacting the window layer 29, and the first insulative layer 31 has a second surface 241 contacting the window layer 29, wherein the first surface 231 and the second surface 241 are substantially at the same level. In one embodiment, the surface area of the first surface 231 is about 10%~50% of a sum of the surface areas of the first surface 231 and the second surface 241, and, in another embodiment, the surface area of the first surface 231 is about 12.5%~25% of a sum of the surface areas of the first surface 231 and the second surface 241. In another embodiment, the second surface 241 can be a rough surface for scattering the light from the light-emitting stack 25 for increasing luminous efficiency of the light-emitting element 100.

In one embodiment, for a light-emitting element with an top-view area larger than 0.25 mm², the multiple pores is preferably not overlapped the electrical contact layer 26, or the insulative structure 3 is preferably disposed as a pattern right under the electrical contact layer 26 and/or the current input portion 271 for better current spreading.

A thickness of the insulative structure 3 is between 20 nm and 2 μm or preferably between 100 nm and 300 nm, wherein the thickness of the first insulative layer 31 is between 10 nm and 1 μm or preferably between 50 nm and 150 nm, and the thickness of the second insulative layer 32 is also between 10 nm and 1 μm or preferably between 50 nm and 150 nm.

The transparent conducting structure 23 includes a first conducting oxide layer 230 below the insulative structure 3 and a second conducting oxide layer 232 between the light-emitting stack 25 and the first conducting oxide layer 230. The second conducting oxide layer 232 conformably covers the insulative structure 3 and fills in the multiple pores 242 to directly contact the window layer 29. The first conducting oxide layer 230 conformably covers the second conducting oxide layer 232. In the present embodiment, a thickness of the second conducting oxide layer 232 is between 1 nm and 1 µm, preferably between 10 nm and 100 nm, or more preferably between 1 nm and 20 nm, and a thickness of the first conducting oxide layer 230 is between 1 nm and 10000 nm, preferably between 10 nm and 1000 nm or more preferably between 50 nm and 150 nm. The first conducting oxide layer 230 comprises a material different from that of the second conducting oxide layer 232. In another embodiment, the first conducting oxide layer 230 comprises one element different from the material of the second conducting oxide layer 232. For example, the first conducting oxide layer 230 is made of indium zinc oxide (IZO), which has a refractive index between 2.0 and 2.2, and the second conducting oxide layer 232 is made of indium tin oxide (ITO), which has a refractive index between 1.8 and 2.0. In the embodiment, the refractive index of the first conducting oxide layer 230 is larger than the refractive index of the second conducting oxide layer 232, the refractive index of the second conducting oxide layer 232 is larger than the refractive index of the second insulative layer 32, and the refractive index of the second insulative layer 32 is larger than the refractive index of the first insulative layer 31 so the refractive indices of the first insulative layer 31, the second insulative layer 32, the second conducting oxide layer 232 and the first conducting oxide layer 230 gradually increase along the direction from the light-emitting stack toward the reflection structure 22 for reducing the probability of occurrence of total-internal-reflection (TIR) between the first insulative layer 31 and the second insulative layer 32, between the second insulative layer 32 and the second conducting oxide layer 232, and between the second conducting oxide layer 232 and the first conducting oxide layer 230 for the light reflected by the reflection structure 22 toward the light-emitting stack 25.

In another embodiment, a thickness of the insulative structure 3 is less than ⅕ of a thickness of the transparent conducting structure 23 to prevent a planarization process for planarizing the transparent conducting structure 23 from damaging the insulative structure 3. The insulative structure 3 is substantially fully covered by the second conducting oxide layer 232 such that the second conducting oxide layer 232 provides strong adhesion force joining to the window layer 29 so as to enhance mechanical strength. In another embodiment, the transparent conducting structure 23 is omitted between the insulative structure 3 and the reflection structure 22, and therefore, the insulative structure 3 is directly join to the reflection structure 22 for preventing an connecting interface of the reflection structure 22 and transparent conducting structure 23 from peeling because of poor adhesion force between the insulative structure 3 and the transparent conducting structure 23. The transparent conducting structure 23 fills the multiple pores 242 to from an ohmic contact with the window layer 29. The transparent conducting structure 23 is transparent to light emitted from the light-emitting stack 25. Additionally, the transparent conducting structure 23 and the reflection structure 22 together form an omni-directional reflector (ODR) for perfectly reflecting the light emitted from the light-emitting stack 25. The material of the first conducting oxide layer 230 and the second conducting oxide layer 232 comprises indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO), indium cerium oxide (ICO), indium tungsten oxide (IWO), indium titanium oxide (ITiO), indium zinc oxide (IZO), indium gallium oxide (IGO), gallium aluminum zinc oxide (GAZO), or a combination thereof. Therefore, even if the light emitted from the light-emitting stack 25 is not reflected by the total-internal-reflection (TIR) interface between the first insulative layer 31 and the window layer 29, the light can be reflected by the omni-directional reflector (ODR) made from the transparent conducting structure 23 and the reflection structure 22 so the light extraction efficiency of the light-emitting element 100 is increased.

The reflection structure 22 has a reflectivity over 90% for the light emitted from the light-emitting stack 25, and the material of the reflection structure 22 can be metal material including, but not limited to copper (Cu), aluminum (Al), tin (Sn), gold (Au), silver (Ag), lead (Pb), titanium (Ti), nickel (Ni), platinum (Pt), tungsten (W) or an alloy thereof. The reflection structure 22 includes a reflection layer 226, an adhesion layer 224 below the reflection layer 226, a barrier layer 222 below the adhesion layer 224, and an ohmic contact layer 220 below the barrier layer 222. The reflection layer 226 can reflect light emitted from the light-emitting stack 25. The adhesion layer 224 adheres to the reflection layer 226 and the barrier 222. The barrier layer 222 can prevent the material of the reflection layer 226 from diffusing to the ohmic contact layer 220 and lowering the reflectivity of the reflection layer 226. The ohmic contact layer 220 forms an ohmic contact with the conducting adhesive layer 21. The conducting adhesive layer 21 connects to the substrate 20 and the reflection structure 22 and includes a plurality of sub-layers (not shown in figures), wherein the plurality of sub-layers can be made of transparent conducting material or metal material. The transparent conducting material comprises indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), zinc oxide (ZnO), gallium phosphide (GaP), indium cerium oxide (ICO), indium tungsten oxide (IWO), indium titanium oxide (ITiO), indium zinc oxide (IZO), indium gallium oxide (IGO), gallium aluminum zinc oxide (GAZO), or a combination thereof. The metal material comprises copper (Cu), aluminum (Al), tin (Sn), gold (Au), silver (Ag), lead (Pb), titanium (Ti), nickel (Ni), platinum (Pt), tungsten (W), or an alloy made of the above mentioned.

The substrate 20 can support the light-emitting stack 25 and be made of a conducting material. For example, the conducting material comprises metal, such as copper (Cu), aluminum (Al), molybdenum (Mo), tin (Sn), zinc (Zn), cadmium (Cd), nickel (Ni) and cobalt (Co), carbon compound, such as diamond like carbon (DLC), graphite and carbon fiber, composite, such as metal matrix composite (MMC), ceramic matrix composite (CMC), or semiconductor, such as silicon (Si), zinc selenide (ZnSe), gallium arsenide (GaAs), silicon carbide (SiC), gallium phosphide (GaP), gallium arsenide phosphide (GaAsP), indium phosphide (InP), $LiGaO_2$ and $LiAlO_2$.

The principle and the efficiency of the present application illustrated by the embodiments above are not the limitation of the application. Any person having ordinary skill in the art can modify or change the aforementioned embodiments.

Therefore, the protection range of the rights in the application will be listed as the following claims.

What is claimed is:

1. A light-emitting element, comprising:
   a light-emitting stack comprising an active layer for emitting a light;
   a window layer on the light-emitting stack; and
   a first insulative layer having a first refractive index on the window layer;
   wherein the window layer has a second refractive index, and a difference between the first refractive index and the second refractive index is larger than 1.5,
   wherein, from a cross section of the light-emitting element, the window layer has a surface contacting a first surface of the first insulative layer and a ratio of a surface area of the first surface of the first insulative layer to a surface area of the surface of the window layer is between 0.5-0.9.

2. The light-emitting element of claim 1, wherein the first insulative layer comprises a compound of group IIA or a compound of group VILA.

3. The light-emitting element of claim 2, wherein the first insulative layer comprises magnesium fluoride.

4. The light-emitting element of claim 1, wherein the first refractive index is smaller than the second refractive index.

5. The light-emitting element of claim 4, wherein the first refractive index is equal to or smaller than 1.4.

6. The light-emitting element of claim 1, further comprises a transparent conducting structure on the first insulative layer.

7. The light-emitting element of claim 6, wherein the first insulative layer comprises multiple pores, and the transparent conducting structure directly contacting the surface of the window layer through the multiple pores.

8. The light-emitting element of claim 7, wherein the transparent conducting structure having a second surface contacting the surface of the window layer, and a ratio of a surface area of the second surface of the transparent conducting structure to the surface area of the surface of the window layer is between 0.1250.25.

9. The light-emitting element of claim 6, wherein a thickness of the first insulative layer is less than a half of a thickness of the transparent conducting structure.

10. The light-emitting element of claim 6, wherein the transparent conducting structure comprises a first conducting oxide layer and a second conducting oxide layer, and the second conducting oxide layer is between the first insulative layer and the first conducting oxide layer, and the first conducting oxide layer has a refractive index smaller than a refractive index of the second conducting oxide layer.

11. The light-emitting element of claim 10, wherein the third refractive index is between 2 and 2.2, and the fourth refractive index is between 1.8 and 2.1.

12. The light-emitting element of claim 10, wherein the second conducting oxide layer has a thickness between 1 nm and 1 μm and the first conducting oxide layer has a thickness between 10 nm and 1 μm.

13. The light-emitting element of claim 7, wherein one of the multiple pores has a length or a diameter between 2 μm and 20 μm.

14. The light-emitting element of claim 7, further comprising an electrical contact layer on the light-emitting stack opposite to the first insulative layer, and the electrical contact layer does not overlap the multiple pores from a top view of the light-emitting element.

15. The light-emitting element of claim 7, wherein a top-view shape of one of the multiple pores comprises a polygon or a circle.

16. The light-emitting element of claim 6, further comprising a reflection structure on the transparent conducting structure, a substrate on the reflection structure, and a conducting adhesive layer connecting the substrate to the reflection structure.

* * * * *